(12) United States Patent
deVilliers et al.

(10) Patent No.: US 10,712,663 B2
(45) Date of Patent: Jul. 14, 2020

(54) HIGH-PURITY DISPENSE UNIT

(71) Applicant: Tokyo Electron Limited, Tokyo (JP)

(72) Inventors: Anton J. deVilliers, Clifton Park, NY (US); Ronald Nasman, Averill Park, NY (US); David Travis, Albany, NY (US); James Grootegoed, Wynantskill, NY (US); Norman A. Jacobson, Jr., Scotia, NY (US)

(73) Assignee: Tokyo Electron Limited, Tokyo (JP)

( * ) Notice: Subject to any disclaimer, the term of this patent is extended or adjusted under 35 U.S.C. 154(b) by 26 days.

(21) Appl. No.: 15/675,376

(22) Filed: Aug. 11, 2017

(65) Prior Publication Data
US 2018/0046082 A1      Feb. 15, 2018

Related U.S. Application Data

(60) Provisional application No. 62/373,724, filed on Aug. 11, 2016.

(51) Int. Cl.
| | |
|---|---|
| *G03F 7/16* | (2006.01) |
| *B05B 9/04* | (2006.01) |
| *B05B 9/047* | (2006.01) |
| *B05C 11/10* | (2006.01) |
| *H01L 21/027* | (2006.01) |
| *H01L 21/66* | (2006.01) |

(Continued)

(52) U.S. Cl.
CPC ............... *G03F 7/16* (2013.01); *B05B 9/047* (2013.01); *B05B 9/0409* (2013.01); *B05C 11/1013* (2013.01); *H01L 21/0274* (2013.01); *H01L 22/26* (2013.01); *B05B 9/0838* (2013.01); *G03F 7/30* (2013.01)

(58) Field of Classification Search
CPC .......... B05B 9/04–0894; B05C 5/0225; B05C 11/1013
See application file for complete search history.

(56) References Cited

U.S. PATENT DOCUMENTS

| | | | |
|---|---|---|---|
| 2,467,150 | A | 4/1949 | Nordell |
| 2,517,820 | A | 8/1950 | Aagaard |
| 2,598,307 | A | 5/1952 | Ulrich |

(Continued)

FOREIGN PATENT DOCUMENTS

| | | |
|---|---|---|
| CN | 1873286 C | 12/2006 |
| JP | A2002231668 A | 8/2002 |

(Continued)

*Primary Examiner* — Dah-Wei D. Yuan
*Assistant Examiner* — Stephen A Kitt
(74) *Attorney, Agent, or Firm* — Oblon, McClelland, Maier & Neustadt, L.L.P.

(57) ABSTRACT

Techniques herein include a bladder-based dispense system using an elongate bladder configured to selectively expand and contract to assist with dispense actions. This dispense system compensates for filter-lag, which often accompanies fluid filtering for microfabrication. This dispense system also provides a high-purity and high precision dispense unit. A modular hydraulic unit houses the elongate bladder and hydraulic fluid in contact with an exterior surface of the bladder. When pressurized process fluid is in the elongate bladder, hydraulic controls can selectively reduce pressure on the bladder to cause expansion, and then selectively increase hydraulic pressure to assist with a dispense action.

6 Claims, 9 Drawing Sheets

(51) Int. Cl.
*G03F 7/30* (2006.01)
*B05B 9/08* (2006.01)

(56) References Cited

U.S. PATENT DOCUMENTS

| | | | |
|---|---|---|---|
| 4,195,810 A | | 4/1980 | Lavin |
| 4,442,954 A | | 4/1984 | Bergandy |
| 4,867,208 A | * | 9/1989 | Fitzgerald ............ B05B 9/0838 141/18 |
| 5,048,559 A | | 9/1991 | Mathieu |
| 6,478,547 B1 | | 11/2002 | Savard |
| 6,565,333 B2 | * | 5/2003 | Maruyama ............ F04B 17/003 417/206 |
| 6,568,416 B2 | | 5/2003 | Tucker |
| 6,797,063 B2 | | 9/2004 | Mekias |
| 7,335,003 B2 | | 2/2008 | Kingsford |
| 9,718,082 B2 | | 8/2017 | Devilliers |
| 2003/0062382 A1 | | 4/2003 | Savard |
| 2003/0075555 A1 | | 4/2003 | Mekias |
| 2006/0075965 A1 | | 4/2006 | Lee |
| 2006/0174656 A1 | | 8/2006 | Flynn |
| 2006/0275141 A1 | | 12/2006 | Ogawa |
| 2008/0169230 A1 | | 7/2008 | Nakagawa |
| 2015/0209818 A1 | * | 7/2015 | deVilliers ............ B05C 5/0225 137/500 |

FOREIGN PATENT DOCUMENTS

| | | |
|---|---|---|
| JP | 2011-21611 | 2/2011 |
| KR | 20060065188 A | 6/2006 |

\* cited by examiner

HIGH-PURITY DISPENSE UNIT

CROSS REFERENCE TO RELATED APPLICATIONS

The present application claims the benefit of U.S. Provisional Patent Application No. 62/373,724, filed on Aug. 11, 2016, entitled "High-Purity Dispense Unit," which is incorporated herein by reference in its entirety.

BACKGROUND OF THE INVENTION

This disclosure relates to semiconductor fabrication, and, in particular, to film dispensing/coating and developing processes and systems.

Various microfabrication processes using coater/developer tools specify different chemicals to be dispensed onto a substrate (wafer) for particular designs. For example, various resist (photoresist) coatings can be dispensed onto a substrate surface. Resist coatings can vary by type of reaction to actinic radiation (positive/negative) and also by composition for different stages of patterning (front-end-of line, metallization, et cetera). Additionally, various developers and solvents may be selected to be dispensed onto a wafer. One challenge, however, in being able to dispense various chemicals onto a wafer is avoiding defects in the dispensed chemicals. Any small impurity or coagulation in the chemical can create defects on a wafer. As semiconductor features continue to decrease in size, avoiding and preventing defects from dispensed chemicals becomes increasingly important.

SUMMARY

One option to avoid defects from liquids dispensed onto a substrate is to purchase pre-filtered chemistry for use in a coater/developer tool. Such pre-filtered chemistry, however, can be very expensive and can develop defects in the chemistry during transport or use despite pre-filtering. Another option to avoid defects is to filter chemicals at a semiconductor fabrication tool (for example, a coater/developer "Track" tool) immediately prior to dispensing on a substrate. One complication with filtering immediately prior to dispensing (point of use filtering) is a reduction in flow rate. For example, to deliver fluid that has been sufficiently filtered to meet purity requirements, relatively fine filters are needed. A challenge with using such fine filters is that these filters decrease a rate of fluid flow of a given chemistry as the fluid chemistry is being pushed through these relatively fine filters. Many semiconductor fabrication processes require chemistries to be dispensed at a specific flow rate (or flow rate range) that adheres to specified parameters. Having a flow rate above or below such a given specified flow rate can result in defects on a substrate, insufficient coverage, and/or excessive coverage. In other words, it is difficult to push a fluid through increasingly fine filters fast enough to meet dispense flow requirements.

Techniques disclosed herein provide a fluid delivery system that compensates for relatively slow fluid filtering rates while simultaneously providing specified dispense flow rates with digital dispense control. In other words, systems herein can dispense a filtered liquid onto a substrate at a dispense rate faster than a filtration rate yet at high purity.

Such a system can include an apparatus for fluid delivery. A hydraulic fluid housing defines a chamber with an elongate bladder positioned therein. The elongate bladder extends from a chamber inlet opening to a chamber outlet opening. The chamber provides a bladder expansion constraint that permits expansion of the elongate bladder to a predetermined volume and prevents expansion of the elongate bladder beyond the predetermined volume. The elongate bladder defines a fluid flow path that is linear between the chamber inlet opening and the chamber outlet opening. The elongate bladder is configured to laterally expand and laterally contract within the chamber such that when the elongate bladder contains process fluid, a volume of the process fluid within the elongate bladder is increasable and reducible. The chamber is configured to contain hydraulic fluid in contact with an exterior surface of the elongate bladder. The hydraulic fluid housing includes a displacement chamber in fluid connection with the chamber containing the elongate bladder. The displacement chamber includes a displacement member that is insertable into the displacement chamber and retractable from the displacement chamber. The system includes a controller configured to activate a volume-control system that selectively decreases hydraulic fluid pressure on the elongate bladder by retracting a portion of the displacement member from the displacement chamber causing expansion of the elongate bladder. The controller is configured to activate the volume-control system that selectively increases hydraulic fluid pressure on the elongate bladder by inserting a portion of the displacement member into the displacement chamber causing contraction of the elongate bladder.

Such techniques can reduce defectivity of deposited films. Film defectivity can result from gas bubbles, fall-on particles, organic residue/polymer, metal impurities, coagulated particles, etc. All these defect source and formation mechanisms are strongly impacted by a coater/developer dispense line design and configuration. One cause or mechanism for gas bubble defects can be related to gas dissolved into a liquid chemical (process fluid) to be dispensed. Dissolved gas can then find its way into a film during a dispense step as a bubble defect or the bubble itself can act as a nucleation site to attract small particles into a big particle that is then deposited into the film during a dispense step. One contributing factor to particle generation, organic residue, and metal impurities is the parts that make up the dispense line (pump, valves, tanks, tubes, fittings, et cetera).

Techniques herein minimize defects that cause gas dissolution by using an indirect dispense system. With systems herein, exposure of the process fluid to gas and atmosphere is minimized. Furthermore, systems herein reduce other defect types such as fall-on particle, organic residue/polymer and metal impurities by minimizing parts (pump, valves, tanks, tube, fitting, et cetera) that are used in a dispense line herein. The benefit of reducing parts in the dispense line can be appreciated because every part increases a potential for causing defects. Minimizing dead space and surface contact between process fluid and parts/hardware can minimize flow eddies by minimizing nucleation sites for chemical aggregation.

Of course, the order of discussion of the different steps as described herein has been presented for clarity sake. In general, these steps and techniques can be performed in any suitable order. Additionally, although each of the different features, techniques, configurations, et cetera, herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1:
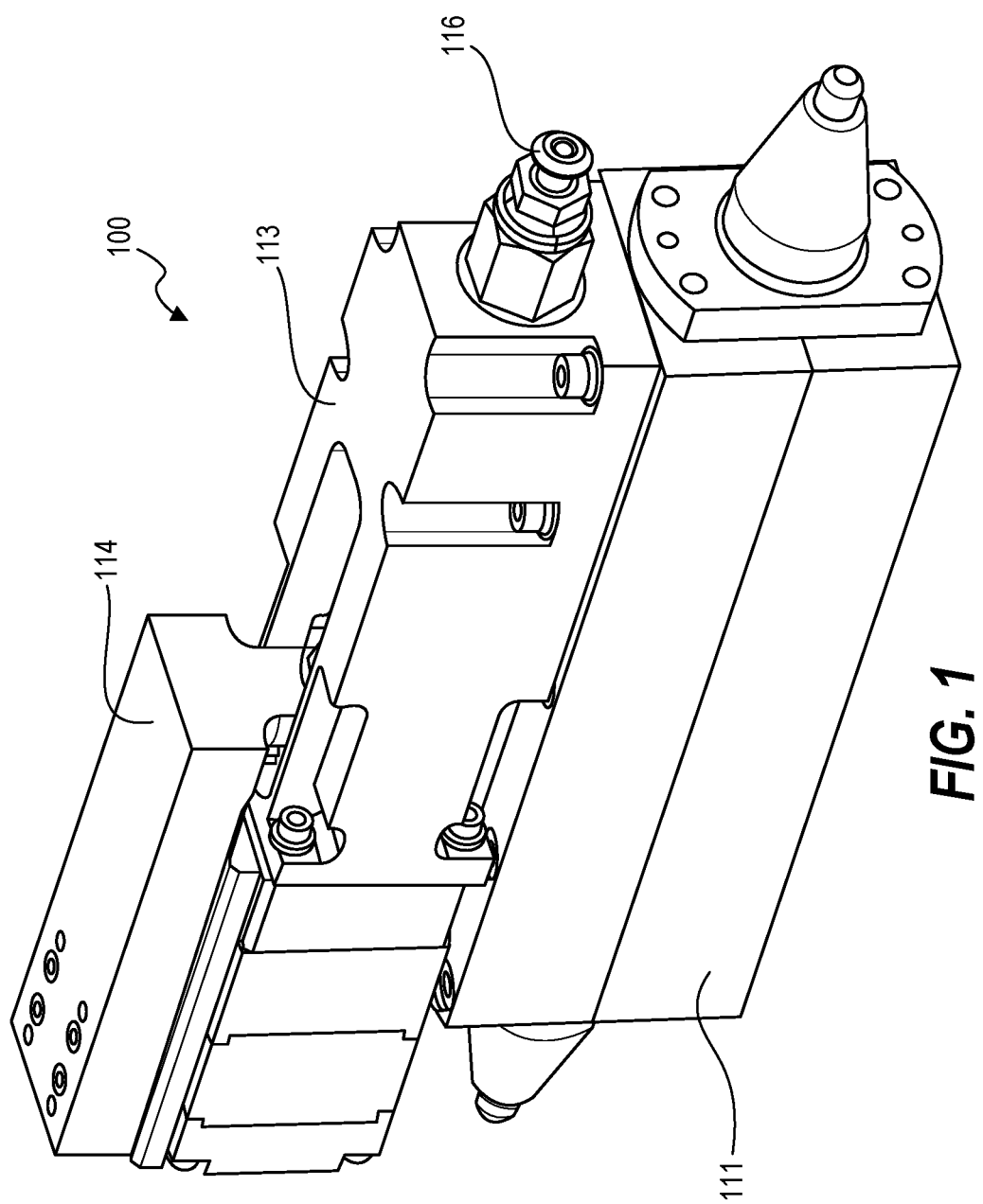
FIG. 1 is a perspective view of a bladder-based dispense unit as described herein.

Techniques herein can be embodied as a bladder-based dispense system using an elongate bladder. This dispense system compensates for filter-lag, which often accompanies fluid filtering for microfabrication. This dispense system also provides a high-purity and high precision dispense unit. This dispense solution herein further reduces chances for defect creation. Conventional fluid delivery systems typically have a "dead leg" hanging off a fluid line. This dead leg can be a branch off the fluid line such as for a pressure measuring device or reservoir. Conventional fluid delivery systems can have other discontinuities that result in a significant chance of creating defects in the fluid, including various valves. Fluid connectors are designed to reduce imperfections on fluid conduit walls (inside walls). Any rough connectors or bends can cause places where fluid can recirculate, slow down, or otherwise get stopped which can cause coagulation. Thus, having a piston, baffle, or side-attached reservoir to the process fluid conduit can create a lot of undesirable cross flow and create places for fluid to get stuck or slow down. Such cross flow and slow spots can lead to particle creation within the fluid. Such particles then become defects when dispensed on a given substrate, such as dispensing photoresist on a silicon wafer.

Accordingly, systems herein include an elongate bladder apparatus using in-direct pressure/volume control to dispense process fluid and minimize gas dissolution into the process fluid, and to reduce the overall parts used by a dispense system. Better fluid dispense results are achieved when this elongate bladder is configured to provide a cross-sectional area (for fluid flow) similar to that of the upstream and downstream conduits. Such a configuration helps to prevent process fluid from having cross flows or slowing of process fluid flow. As fluid enters or passes through the elongate bladder, there is a smooth and gradual widening to maintain laminar flow. During a dispense-off period—that is when fluid is not being dispensed from a corresponding nozzle onto a substrate—process fluid can collect in this bladder (as an expanding bladder) after the process fluid is pushed through a fine filter (micro filter). In one embodiment, this elongate bladder functions as a fluid capacitor for dispensing that is configured to be filled with process fluid having been filtered upstream or just prior to entering the elongate bladder during a dispense-off period. In some example dispense applications, a given fluid is dispensed at a predetermined flow rate (such as 0.4 to 1.4 cubic centimeters per second), and this fluid is dispensed (onto a substrate) for a relatively short time. For example, a given dispense time can last for about one second and then the fluid dispense system may not be used again until after a rest period. This rest period may be anywhere from about 15 seconds to 60 seconds or more for some manufacturing flows.

When dispensing from the nozzle is reinitiated, the elongate bladder unit reverses from a state of collecting process fluid to state of expelling process fluid. In other words, this elongate bladder has the capacity to expand to collect a charge of process fluid and then be selectively compressed to assist with maintaining a particular process fluid flow rate by discharging the collected charge of fluid, which has passed through a micro filter just prior to entering the elongate bladder. Thus, such a configuration provides a system having a dispense capacitor, which includes a bladder or expandable member configured to expand to receive a charge of fluid and to contract to help expel a built-up charge of fluid, all while maintaining a substantially linear flow path of the process fluid through the elongate bladder.

Expansion and contraction of the elongate bladder can be accomplished via a coupled hydraulic system (alternatively a pneumatic system) that controls hydraulic fluid in contact with an exterior surface of the elongate bladder. There can be various cross-sectional shapes of the elongate bladder such as circular, square, and oval. For convenience in describing embodiments herein this disclosure will primarily focus on a bladder having an approximately oval or circular shape. It can be beneficial to have tapering conical ends to connect to process fluid input and process fluid output conduits to gradually transition from a process fluid conduit to a particular elongate bladder shape. Different cross-sectional shapes offer different advantages. One advantage with using a bladder having an oblong cross-sectional shape is having two relatively flat opposing surfaces which can be the primary deflection surfaces for expansion and contraction. In cross-sectional shapes that are substantially uniform or symmetrical (such as a circular cross-section), all sidewall surfaces would be able to expand and contract roughly uniformly, and this shape can provide benefits too.

In typical operation, the elongate bladder has an initial shape or cross section when there is equal pressure on the inside and outside of the elongate bladder. The elongate bladder primarily expands beyond this initial shape to an expanded state (some expanded state up until reaching the bladder expansion constraint) to collect a charge of process fluid and/or halt a dispense action. Then the elongate bladder can be contracted from the expanded state to the initial state. In some embodiments the elongate bladder can be contracted to less than the initial state for a particular dispense operation but substantial contraction beyond the initial state is avoided to prevent defects. Indeed, the system can be configured to prevent pinching of the process fluid by the elongate bladder. If opposite inner walls contact each other to pinch the elongate bladder, then this action could create defects in the process fluid similar to a valve that physically and completely obstructs process fluid flow. The system can be configured to prevent any pinching of the process fluid by the elongate bladder. Thus, apart from the process fluid valve upstream of the process fluid filter, the system does not include any valves capable of completely obstructing process fluid flow through the process fluid conduit between the process fluid filter and the dispense nozzle.

In-direct pressure dispense can be executed by pulling/pushing process fluid out from a chemical bottle or process fluid source container into the dispense system without using direct gas (gas pressure) on the process fluid in the source container. Such a system can use a supply bottle having an inner liner that isolates the gas that is used to squeeze/collapse an inner bag. Alternatively, a conventional fluid-containing bottle can be used together with a pulling device that pulls the process fluid from the source bottle without use of a gas in contact with the process fluid. Another option is to use a gravity feed system incorporating a siphon mechanism.

Another aspect of embodiments herein includes a reduction of overall parts in a dispense system compared to conventional photoresist dispense systems. Embodiments herein include many parts and valves removed from the dispense line (process fluid conduit) after a process fluid filter, that is, downstream the process fluid filter. Particles in the process fluid can be mostly removed with a process fluid filter, but particles created after the process fluid filter can result in defects on a substrate with the defect being in a deposited film.

In some embodiments there are no moving parts in direct contact with the process fluid after passing the process fluid filter. That is, no moving parts apart from the bladder wall itself, but bladder wall movement is distributed and relatively uniform, without the sharp contact or edges associated with conventional moving parts that create process fluid defects. This embodiment can include having no valves after the process fluid filter. Thus, techniques herein eliminate a dispense-valve and associated pump in that the system operates without a pump to drive process fluid through the system and onto a substrate.

Dispense systems herein can be divided into two areas or zones. For example, there is a "clean zone" area which includes a dispense system line and components from a process fluid source to the process fluid filter. There is also a "super clean zone" which includes the dispense line from the process fluid filter to a dispense nozzle. The clean zone area (upstream from process fluid filter) contains all moving parts such as valves tanks, reservoir, etc. The super clean zone area (downstream from the process fluid filter) is free of moving parts that make contact with the process fluid (liquid).

Techniques include a dispense unit having an elongate bladder for expansion and contraction, surrounded by hydraulic fluid, with a piston and/or rod insertable into a hydraulic fluid for volume control of the hydraulic fluid and, by extension, for volume control of the elongate bladder. A dispense unit herein provides a high purity and high precision dispense system. This can include electronic (digital) control of the amount of process fluid that passes through a dispense nozzle during a dispense operation. Also, the dispense unit can provide electronic control of an amount of process fluid pulled back into the dispense nozzle during a post-dispense operation, which is also known as suck-back control. As part of suck-back control, the system can suck back process fluid so that a meniscus rests at a predetermined position within the dispense nozzle, and then the meniscus can be held at that position during recharge of the bladder. Thus, techniques herein provide precise digital suck-back control and meniscus control. Precise dispense and suck-back is in part enabled by a precise piston and/or rod as well as an associated motor. The precision volume-control and elongate bladder enable a valve-less system downstream from the process fluid filter.

Techniques include a dispense nozzle with a precise fluid level detector. The system can detect and control a position of a meniscus in a dispense nozzle. A meniscus sensor provides continuous feedback of liquid meniscus position in the dispense nozzle to the elongate bladder unit for continuous adjustments to bladder volume to maintain the meniscus at a desired position. Systems can include a nozzle system with a shielding device or shroud that creates a beneficial micro-environment around the nozzle by flowing solvent gas around the dispense nozzle to prevent drying of process fluid (such as a photoresist) in the dispense nozzle. As solvents in the process fluid evaporate (at the dispense nozzle being exposed to air because there is no valve), the evaporation can leave behind dried particles which can easily be transferred to a substrate in a subsequent dispense operation. Such a shielding device herein eliminates drying of the process fluid in the nozzle without using a valve that can create defects.

Figure 2:
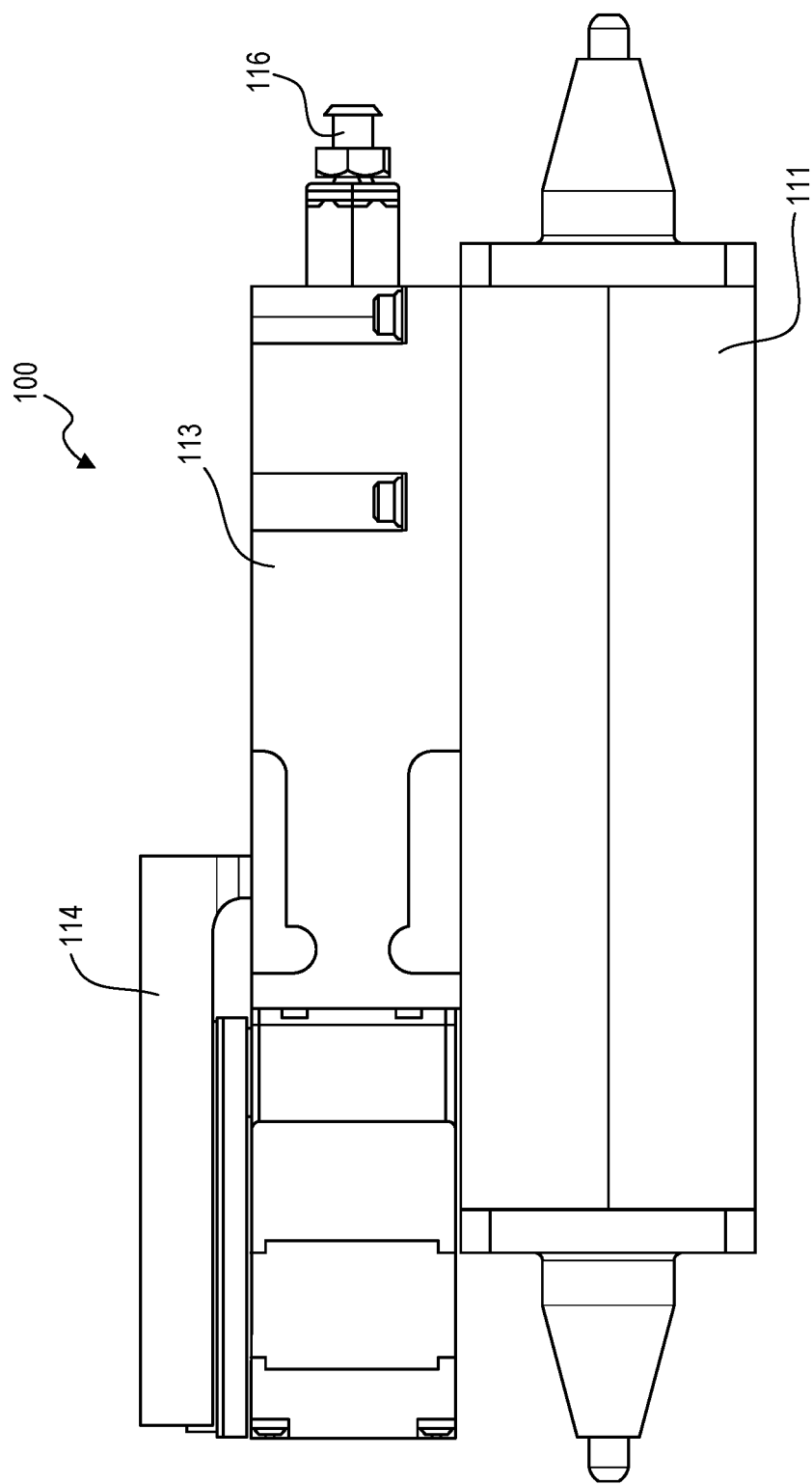
FIG. 2 is a side view of a bladder-based dispense unit as described herein.
Figure 3:
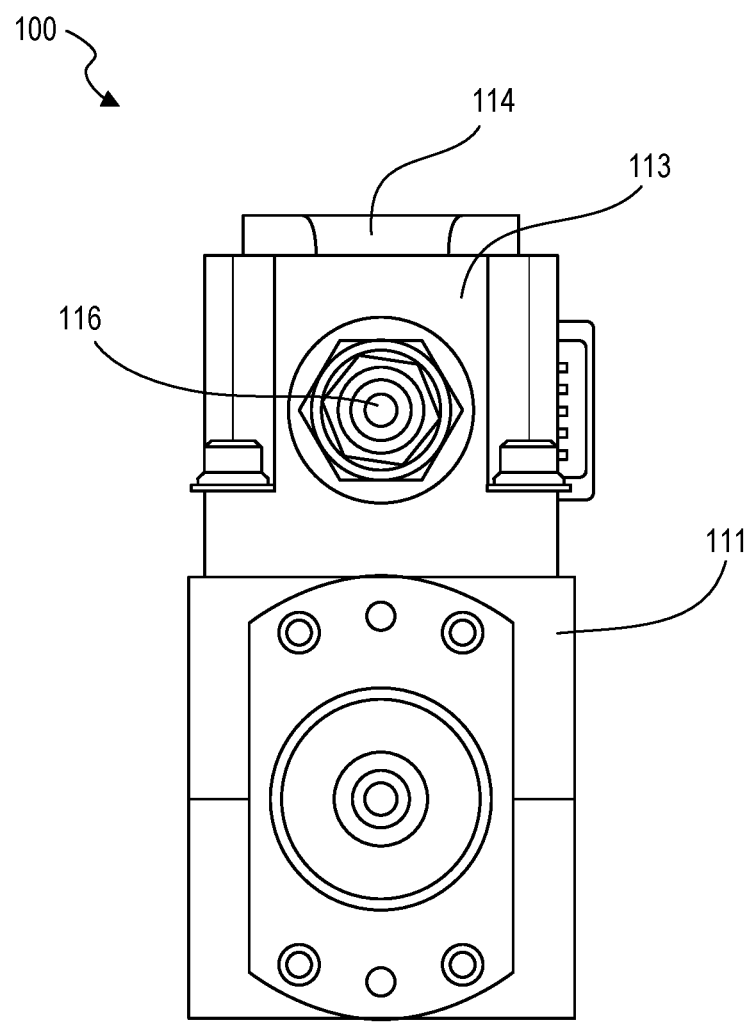
FIG. 3 is a front view of a bladder-based dispense unit as described herein.

Embodiments herein will now be described in more detail. Referring now to FIGS. 1-3 a dispense unit 100 is illustrated, which can be used for fluid delivery. Such a dispense unit 100 can include a hydraulic fluid housing 111 defining a chamber (or bladder chamber) within which an elongate bladder is positioned. Attached to the hydraulic fluid housing 111 is piston rod housing 113 that contains a chamber of hydraulic fluid in fluid connection with the hydraulic fluid housing 111. Piston rod housing 113 can be used to precisely control hydraulic fluid pressure within the elongate bladder unit. An actuator 114 can be employed for moving and controlling the piston rod. Bleed valve 118 can be used to facilitate removal of air from the hydraulic system. Dispense units herein can be configured to operate as a self-contained hydraulic system—embodiments do not need hydraulic tubes or connectors extending to the dispense unit. Embodiments can be compact and function with low hydraulic volume.

Figure 4:
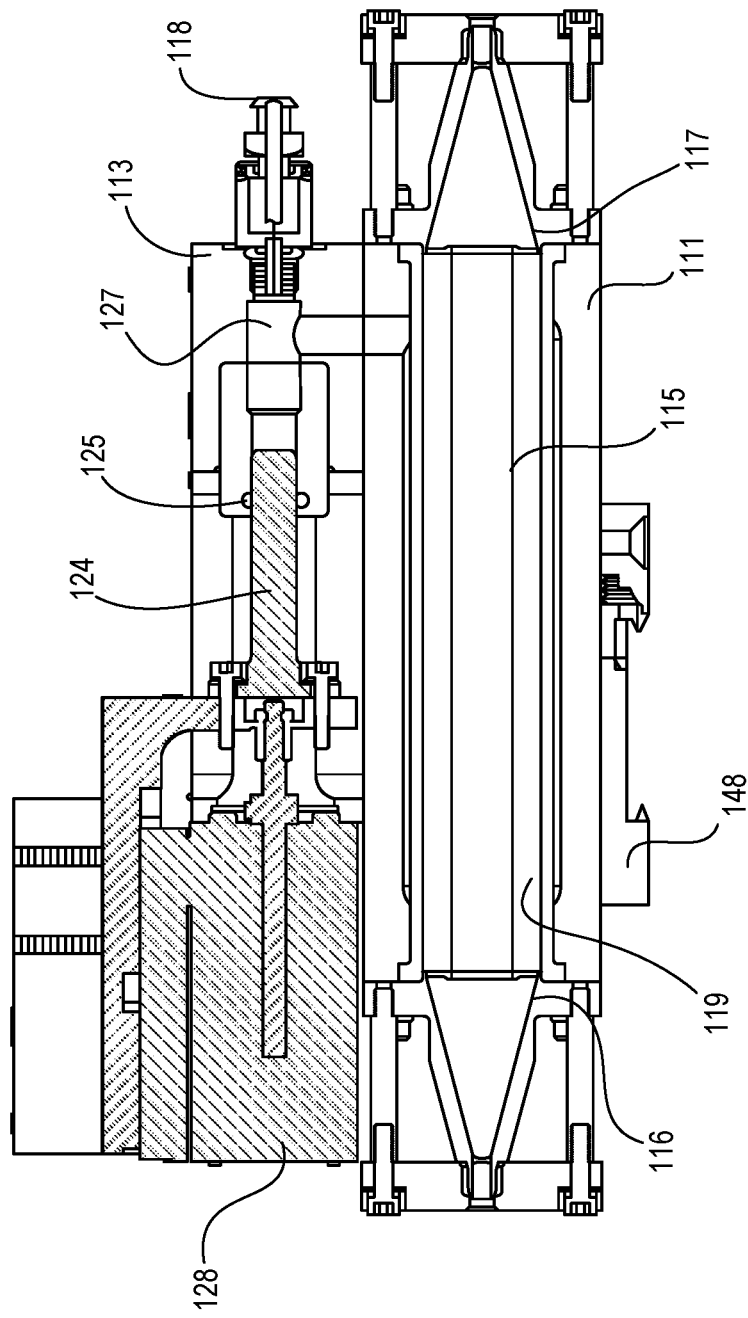
FIG. 4 is a cross-sectional side view of a bladder-based dispense unit as described herein.
Figure 5:
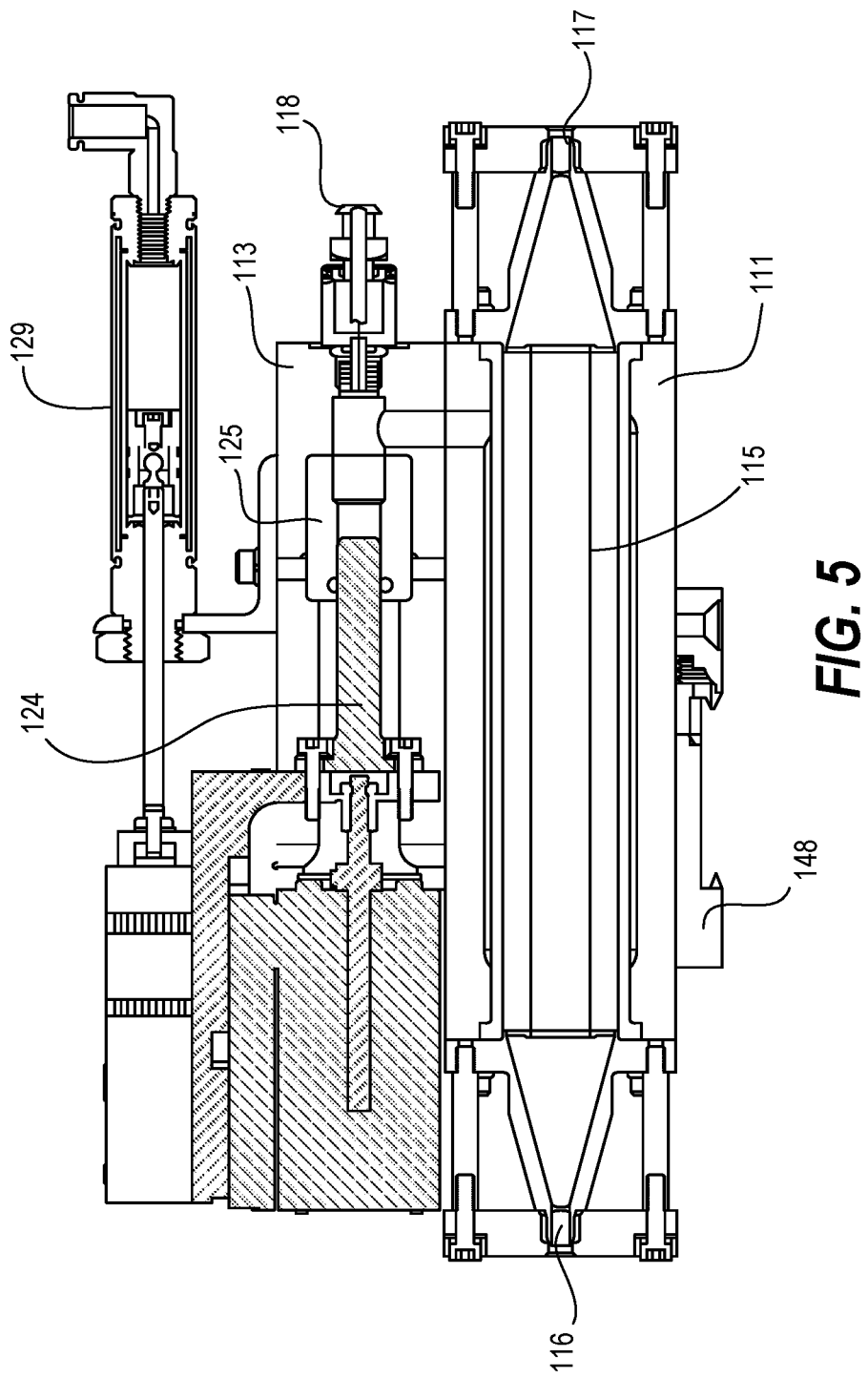
FIG. 5 is a cross-sectional side view of a bladder-based dispense unit as described herein.

Referring now to FIGS. 4 and 5, cross-sectional side views of an example bladder-based dispense unit are illustrated. The elongate bladder 115 extends from a chamber inlet opening 116 to a chamber outlet opening 117. The chamber 119 is sized to permit expansion of the elongate bladder 115 to a predetermined volume and prevent expansion beyond the predetermined volume. The elongate bladder defines a fluid flow path that is linear between the chamber inlet opening 116 and the chamber outlet opening 117. The elongate bladder is configured to laterally expand and contract within the chamber 119 such that when the elongate bladder contains process fluid, a volume of process fluid within the elongate bladder is increasable and reducible.

This embodiment includes a piston rod housing 113 attached to the chamber 119. The piston rod housing includes a piston 124 configured move within a displacement chamber. A motor, such as stepper motor 128, can be used to translate the piston 124 The displacement chamber 127 is in fluid connection with the chamber 119. Accordingly, by moving the piston 124—when hydraulic fluid fills the chamber and displacement chamber—pressure exerted on an exterior surface of the elongate bladder 115 can be increased and reduced. An anti-backlash mechanism 129 can be used to remove play from the hydraulic fluid to increase precision and control of process fluid volume within the elongate bladder. Din rail mount 148 can be used to secure the bladder-based dispense unit within a coater-developer tool or other dispense system that benefits from precisely controlled dispensing of liquid.

Thus, techniques herein can be embodied as a single cassette-style chambered dispense unit inside a closed loop. A hydraulic displacement pin (or rod or piston or multiple pins) can impinge on the hydraulic fluid. This hydraulic fluid is in contact with exterior surface(s) of the elastic elongate bladder. Control for contracting the bladder is a function of how far the pin (or piston(s) or rod(s) or plunger(s)) is inserted into the hydraulic fluid. Likewise, control for expanding the bladder is a function of how much of the pin is removed or pulled back from the hydraulic fluid. Accordingly, extraordinary accurate control for either expanding or contracting the elongate bladder is achieved. Further control of the hydraulic fluid is affected by number and size and combination of pins used. Having a relatively large piston that, for example, fills an entire hydraulic fluid channel can impart relatively larger volumetric changes. A seal can be used around the piston/rod at an opening into the hydraulic fluid chamber to prevent loss of hydraulic fluid. Using a rod or pin having a relatively small cross section can assist with incremental and small changes in volume, which can be beneficial for dispensing relatively small amounts of fluid. Embodiments can alternatively include using multiple rods such as having different size rods for affecting different volume changes.

An actuator can be used to push the piston or rod. The actuator can be a stepper motor, DC motor, servo motor, or other mechanism. Selection of a hydraulic control mechanism can be based on particular dispense requirements. For example, a given system may be designed to dispense from the nozzle at a rate of 0.3-1.0 mL/s. By way of a non-limiting example, typical design considerations for dispensing photoresist onto a semiconductor wafer include dispensing fast enough to avoid drips, yet slow enough to prevent splashing onto the wafer. Dispense speed can also be a function of viscosity of a particular process fluid to be dispensed. Because delivery rate is a function of actuator speed, selection of a particular actuator can be based on desired dispense parameters for a given system.

Figure 6:
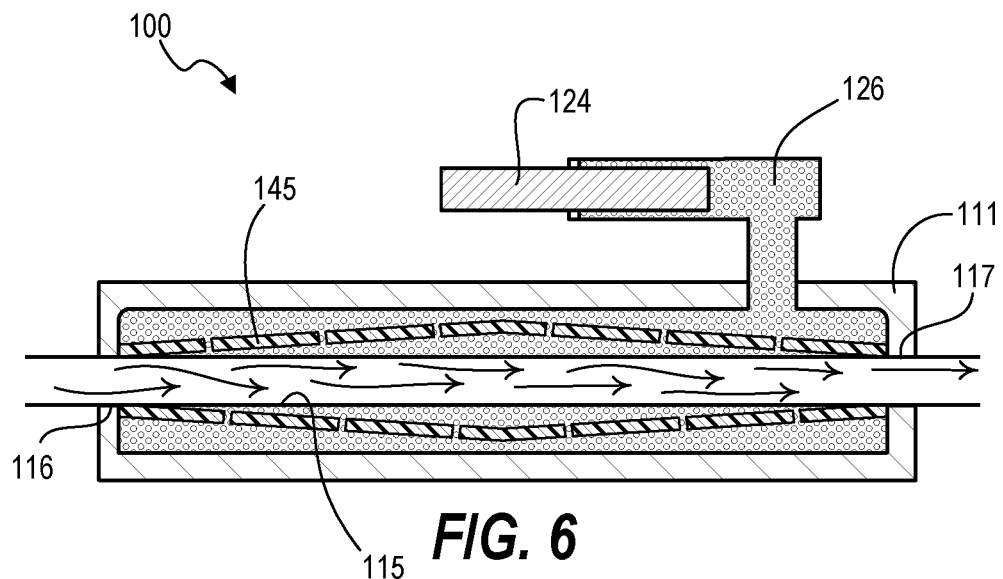
FIG. 6 is a cross-sectional schematic side view of a bladder-based dispense unit as described herein.
Figure 7:
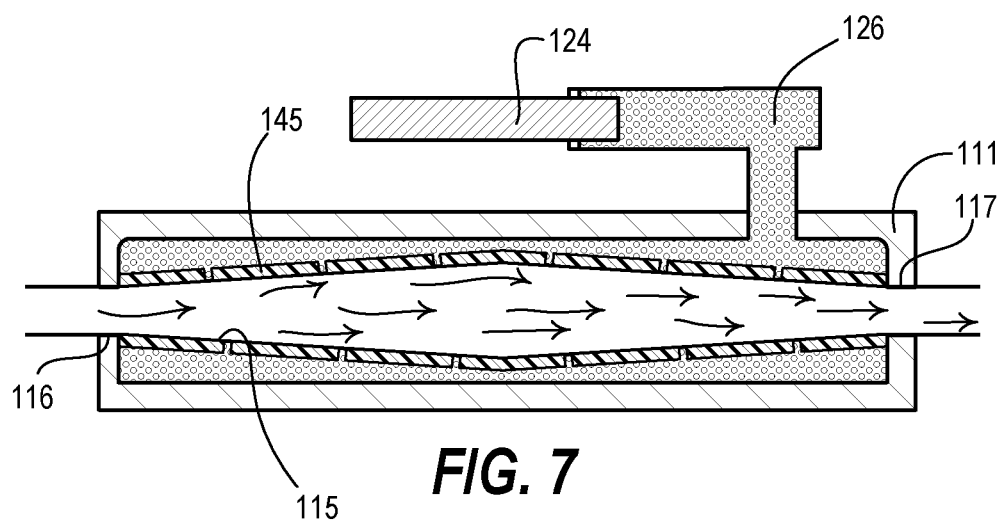
FIG. 7 is a cross-sectional schematic side view of a bladder-based dispense unit as described herein.

Dispense units herein can be chambered or physically constrained beyond a certain point so that the elongate bladder can be over-pressured, or over back pressured. In other words, after pressuring the bladder to a certain point (increasing bladder volume) the bladder contacts a wall and no longer expands, similar to inflating a balloon in a bucket. At a certain point the elongate bladder contacts the chamber walls or a bladder expansion constraint and can no longer expand. FIGS. 6 and 7 are schematic cross sectional views that illustrate this feature. In FIG. 6, elongate bladder 115 is illustrated positioned within chamber 119. Elongate bladder 115 is in a neutral expansion position and shown having a uniform cross-section through which process fluid is flowing. Positioned around the elongate bladder 115 is bladder expansion constraint 145. Note that hydraulic fluid 126 fills gaps between the elongate bladder 115 and the bladder expansion constraint 145. Note also that bladder expansion constraint 145 can include holes or gaps or perforations to provide for ingress and egress of hydraulic fluid. Thus, in one embodiment, the bladder expansion constraint 145 can be configured as a rigid sleeve defining a plurality of openings, or a rigid mesh sleeve can be used.

Figure 8:
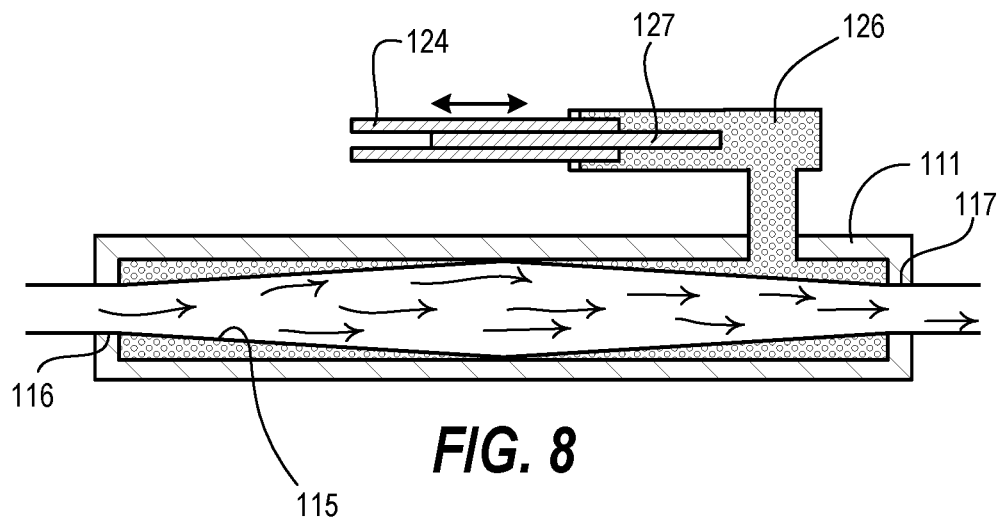
FIG. 8 is a cross-sectional schematic side view of a bladder-based dispense unit as described herein.
Figure 9:
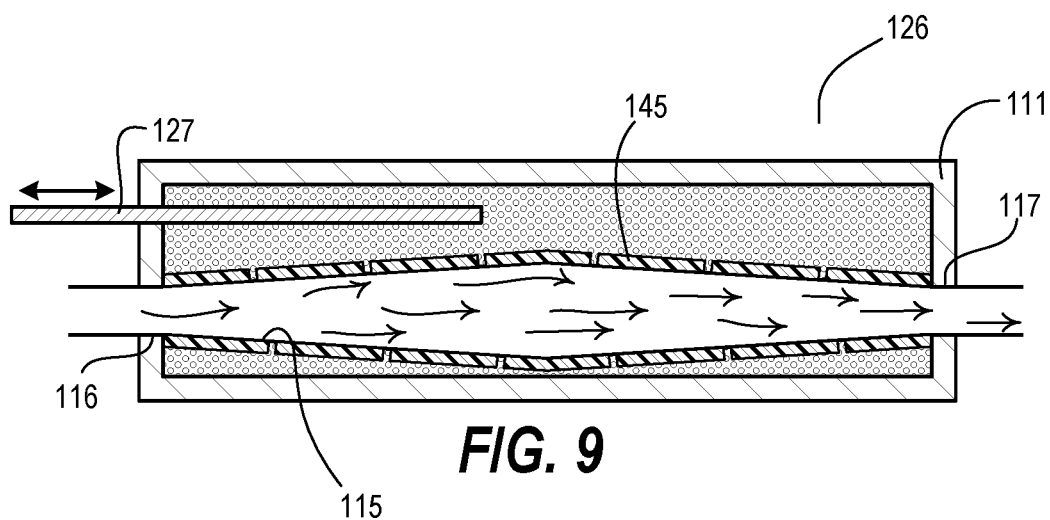
FIG. 9 is a cross-sectional schematic side view of a bladder-based dispense unit as described herein.

As hydraulic fluid pressure exerted on the elongate bladder is decreased, such as by retracting piston 124 from the chamber (or displacement chamber), fluid pressure of the process fluid can cause the elongate bladder to expand and collect a charge of fluid. This expansion is illustrated in FIG. 7. Expansion of the elongate bladder can continue until the bladder fully contacts the bladder expansion constraint. At this point the elongate bladder is prevented from expanding an internal diameter any more. Such a physical constraint prevents hysteresis issues from elastomeric material of the elongate bladder, thereby removing a need for continuous recalibration. FIG. 8 illustrates an embodiment in which the chamber 119 is sized small enough to function as the bladder expansion constraint. FIG. 8 also illustrates an embodiment that uses two displacement members which can include a piston 124 and a rod 125. This can provide two levels of control. The piston 124 can provide larger displacement for more coarse control, while the rod 125, which is smaller, provides finer displacement control. FIG. 9 illustrates a given embodiment in which the displacement member travels into the same chamber in which the elongate bladder 115 is positioned.

With dispense unit embodiments herein, extra hydraulic fluid is not always needed when used with an air piston anti-backlash preload. The air piston can avoid "spongy brakes" or slack in volume changes, so that the chamber does not need to have multiple pins to accurately adjust volume. The air piston can apply pressure on the overall system to take out any residual deformation potential or sponginess. For example, the air piston can be used to eliminate backlash in a linear actuator. Backlash herein includes lost motion when a screw changes direction and following nut or ball bearing shift contact from one wall of the screw to the other. By applying constant force on the shaft, components maintain contact with one side of the screw. A bleed valve for the hydraulic fluid containing area can be used to remove air within the system.

The system can include optical interrupting switches used as limit switches. Alternatively, magnets at the base of rod mounts can be used employing either reed or Hall effect sensors. A linear encoder can optionally be used for closed loop control or for data collection, such as with a meniscus position sensor.

Figure 10:
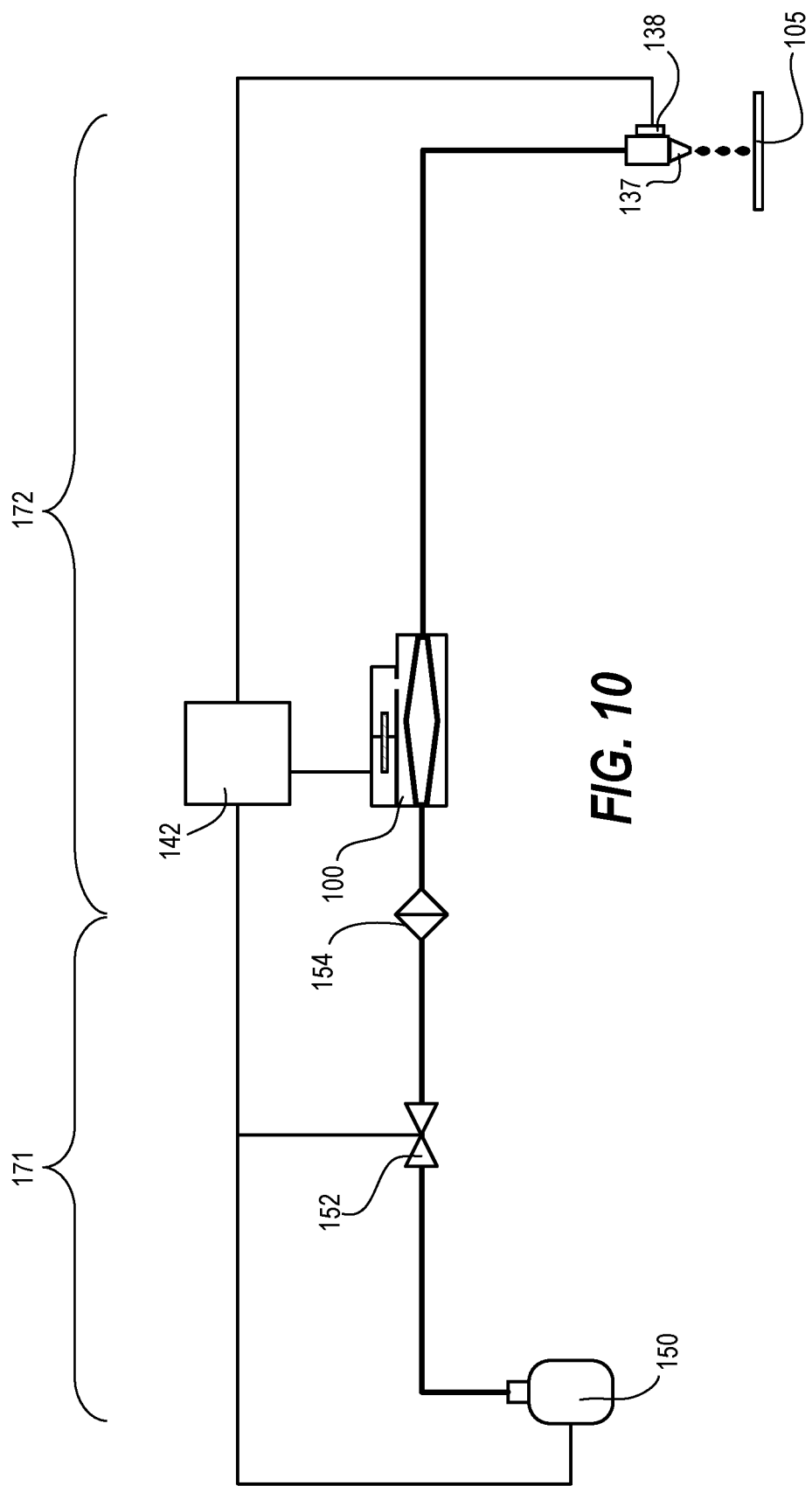
FIG. 10 is a schematic diagram of a dispense system as described herein.

Dispense systems herein leverage the charge-accumulating and dispensing bladder to provide a valve-less dispense system after process fluid filtration. FIG. 10 is a schematic diagram of an example dispense system. Process fluid is supplied or delivered from a process fluid source 150 toward the valve 152. The process fluid source can be, for example, a bottle of photoresist, developer, et cetera. Valve 152 is a fully-closing valve and thus can start or stop flow into the greater dispense system. From valve 152 process fluid flows toward and through a filter 154, which can be a high-purity filter to remove particles and or other contaminants. From the filter 154, process fluid flows to bladder-based dispense unit 100 that includes an elongate bladder.

The dispense unit can expand a volume of the elongate bladder to collect a charge of process fluid. When it is time to dispense process fluid onto a substrate, the dispense unit can contract the elongate bladder which causes filtered process fluid to flow toward the dispense nozzle 137 and out the dispense nozzle to a substrate 105. Note that after process fluid passes the filter 154 there are no valves in the dispense line. This includes having no dispense nozzle valve. Accordingly, downstream of the filter 154 the system is an open-tube design. Normally, with an open-tube system, process fluid would be continuously flowing out of a dispense nozzle when the valve is open. But systems herein use an expandable bladder to suck-back process fluid and collect a charge of process fluid to prevent fluid dispense at undesired times. Recharging rates can be adjusted to particular dispense cycles. For example, a given system may need to deposit process fluid on different substrates every 30 seconds or every 45 seconds or every 60 seconds. Based on dispense cycles and process fluid filtration, a particular recharge rate can be set. For longer periods between dispense operations, the valve 152 can be shut as the elongate bladder should not indefinitely collect a charge.

Having no valves after the process fluid filter means less opportunity for defect creation. Some liquid compositions have higher tendencies to self-aggregate (such as certain silicon-containing anti-reflective coatings) and the self-aggregation problem increases with more physical contact (valves, bleed offs, etc.) and so it can be typical to purge a gallon of such materials at the start of a fabrication lot or when changing fluids. The dispense unit and dispense system herein do not give such materials an aggregation opportunity and thus increase efficiency of materials use. Conventional systems typically include many mechanical elements including augmentation valves, pre-charge chambers, bleed screws, purge locations, coarse and fine needle valves, buffer tanks, bubblers, et cetera, that attempt to prevent defects, but all of these features can themselves create defects. Accordingly, having no mechanical devices in contact with process fluid after filtration, as disclosed herein, provides a high purity dispense, and the fine motor control of the dispense unit provides high precision dispensing.

The configuration of the dispense system herein essentially separates a process fluid line into two areas or zones. Again referring to FIG. 10, zone 171 can be referred to as a "clean" zone, while zone 172 can be referred to as a "super-clean" zone. Note that valve 152 as well as process fluid source 150 are located in the clean zone on an upstream side of the process fluid filter. The clean zone can be considered as a less-critical area (compared to the super-clean zone) because process fluid has not yet passed through a final filter prior to dispense. Still, valve 152 can have a soft open and close as well as electronic control. After the filter 154 (final filter) there are no impingement or aggregation sites, with the dispense line (conduit) being pass-through from the filter 154 to the dispense nozzle 137. Thus, in the super clean zone there are no mechanical moving parts in contact with the process fluid, save for smooth expansion and contraction of the elongate bladder.

Embodiments of the dispense system herein can also include meniscus control with continuous monitoring and feedback. A meniscus sensor 138 can monitor meniscus position at the dispense nozzle 137 at a relatively high sample rate (ten or more cycles per second) and transmit meniscus position data (including meniscus position changes) to a controller 142 that controls the elongate bladder expansion and contraction. Accordingly a meniscus position can be maintained within a the dispense nozzle 137 at a predetermined location between dispense operations. This includes control of suck-back after process fluid dispense using expansion of the elongate bladder.

Techniques herein can provide digital suck back in part by having enough volumetric shifts back and forth to keep the meniscus in play. The meniscus can stop on a dispense line and then maintain a position within a nozzle region of the system. With conventional systems this would not be possible using an open-tube system. Such control, however, is possible with techniques herein leveraging the elongate bladder. The dispense unit can be configured to respond to meniscus position feedback with little delay. For example a meniscus position sensor, such as an optical sensor, identifies meniscus position and changes in meniscus (typically imperceptible to the human eye) by monitoring meniscus position. Then a PID control loop is used to immediately make volumetric bladder changes one way or the other. For example, one response is to rapidly expand the elongate bladder to uptake the volumetric change of a pressure pulse that is about to hit the meniscus. A result of this response is that process fluid remains in the nozzle without dispensing onto a substrate.

Figure 11:
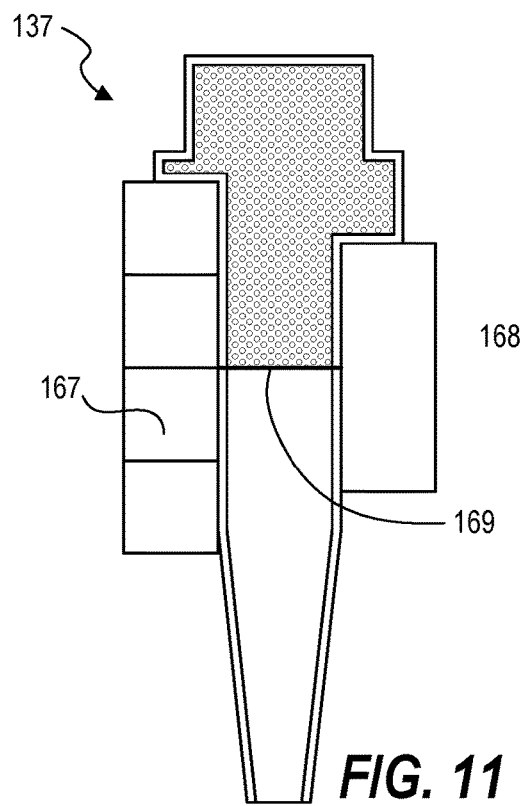
FIG. 11 is a cross-sectional schematic view of a nozzle and meniscus sensor as described herein.

Any sensor can be used that can monitor a position of the meniscus in a nozzle region and detect changes in position in sufficient time to relay positional change so the dispense unit can make volumetric adjustments to keep the meniscus within a predetermined position range. Referring now to FIG. 11, in one embodiment an optical sensor is used with dispense nozzle 137. An electronic light sensor 168, such as a linear photodiode array (PDA) sensor or a charge-coupled device (CCD) sensor is positioned on the dispense nozzle 137 or nozzle region. The nozzle region can include the nozzle, tapered portion of a nozzle, or the nozzle and a predetermined length of conduit immediately before the dispense nozzle 137. Light source 167, such as light-emitting diodes (LEDs) are mounted opposite the light sensor to provide illumination. An electronic light sensor 168 can then be used to detect meniscus position 169. Control loop response time can be configured to be less than ten milliseconds. Surface mount LED's with light diffuser can alternatively be used. Alternatively, a capacitive sensor, vision camera system, time-domain reflectometer, or ultrasonic sensor can be used. A stepper motor can be included in the control loop and can make quick changes to keep the meniscus at a predetermined hold position. Accordingly, systems herein can hold the meniscus at the meniscus position despite having no valve at the dispense nozzle 137 and despite any physically jarring action to the system or variable flow rates past the process fluid filter. Meniscus position monitoring provides digital suck back control. During a dispense operation, the elongate bladder can be contracted or compressed using the hydraulic fluid. This action contributes to process fluid exiting the dispense nozzle onto a substrate. Additional flow can be provided from the process fluid source. After a dispense operation is completed, the system can cause expansion of the elongate bladder until a meniscus of the process fluid is sucked back to a predetermined position within the nozzle region. Meniscus monitoring sensors can be positioned directly on the nozzle itself, or in view of the nozzle.

Figure 12:
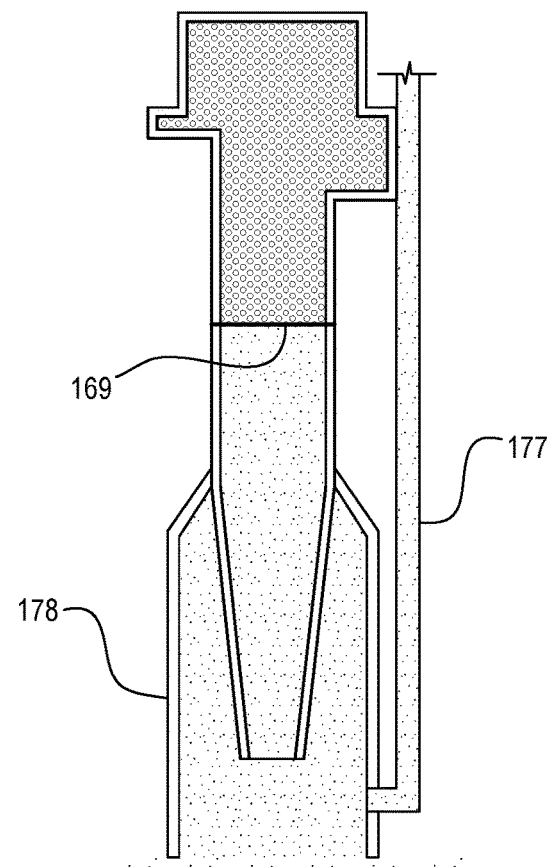
FIG. 12 is a cross-sectional schematic view of a nozzle and meniscus sensor as described herein.
Figure 13:
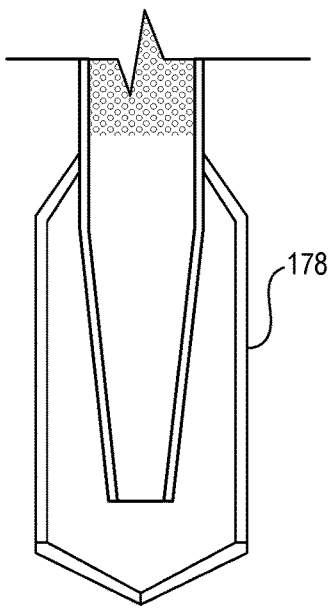
FIG. 13 is a cross-sectional schematic view of a nozzle and evaporation prevention device as described herein.

Embodiments can include techniques to keep the meniscus of process fluid from evaporating when not dispensing to prevent defects. As has been described, systems herein operate without a valve at the nozzle. At the nozzle, process fluid is maintained within the nozzle or nozzle region with a meniscus exposed to air. As solvents in the process fluid evaporate, the evaporation can leave behind dried particles which can easily be transferred to a substrate in a subsequent dispense operation. Referring now to FIG. 12, embodiments can include using an evaporation shield 178, and/or a solvent gas supplier 177. The evaporation shield 178 can provide a shroud, partial enclosure, or full enclosure (encapsulation) of the nozzle to prevent or reduce evaporation. A shield device with full enclosure can encase an end of the nozzle without touching the nozzle. Thus, no mechanical parts contact the meniscus for particle generation. The evaporation shield 178 can be configured to open and close depending on dispense actions, thereby containing evaporation when closed, and then opening to allow a dispense action. FIG. 13 illustrates an example of evaporation shield 178 in a closed position to contain or minimize evaporation without touching the process fluid. In place of, or in addition to, the shielding device, gas-based solvent can be supplied to the nozzle. By saturating the air in contact with the process fluid meniscus, solvents of the process fluid have a reduced opportunity to evaporate from the process fluid to leave a higher concentration of solids. Accordingly, such techniques can prevent or reduce evaporation at the meniscus without having mechanical parts that are in physical contact with the process fluid meniscus.

Systems herein include several operating states. One operating state is that of holding a meniscus position. Before dispense, or during idle, the elongate bladder is used to maintain the process fluid meniscus at a specific location within the nozzle or nozzle region using feedback from a meniscus position sensor. Another operating state is that of dispensing fluid. If process fluid meniscus is not at a desired position, then the bladder is used to adjust the meniscus into position. The bladder can then dispense a desired process fluid volume at a desired rate onto a substrate, such as a semiconductor wafer, and then stop the dispense operation, and suck-back the meniscus to a hold position. Note that no valve is operated during the dispense operation, that is, there is no valve downstream of the process fluid filter. Another operation state is that of recharging the elongate bladder. The valve (on upstream side of filter) is open to allow process fluid to flow into the elongate bladder. The elongate bladder is expanded to refill a fluid charge volume as well as to manage a meniscus hold position. When the bladder has been refilled, and no subsequent dispense is needed, then the valve can be closed.

Systems herein can hold a meniscus position based on pixel movement. When detecting pixel movement greater than (for example) 5 pixels, the system can make a volume adjustment. Accordingly, with techniques herein, a meniscus can be held at a particular hold position within +/−1 millimeter of a set position. Systems herein, can be configured to dispense approximately 0.5 ml in approximately one second. In one example recharge flow, the valve is opened to allow process fluid to flow through the filter and into the elongate bladder. Dispense unit volume-control motor can be started using PID control to keep meniscus in hold position. Valve 152 can be closed when a stage position reaches a recharge set point. Motor can be stopped after an optional delay to allow extra fluid to bleed from the filter. Then a proportional controller can be used to position the meniscus at a hold position. Depending on system parameters and sizes, recharge of filtered process fluid in the bladder can take 5-30 seconds. Thus, the system here can have substrate cycle times of less than approximately 20 seconds. Systems herein can provide a valve-less dispense system with high repeatability and meniscus control within approximately 1 millimeter.

Figure 15:
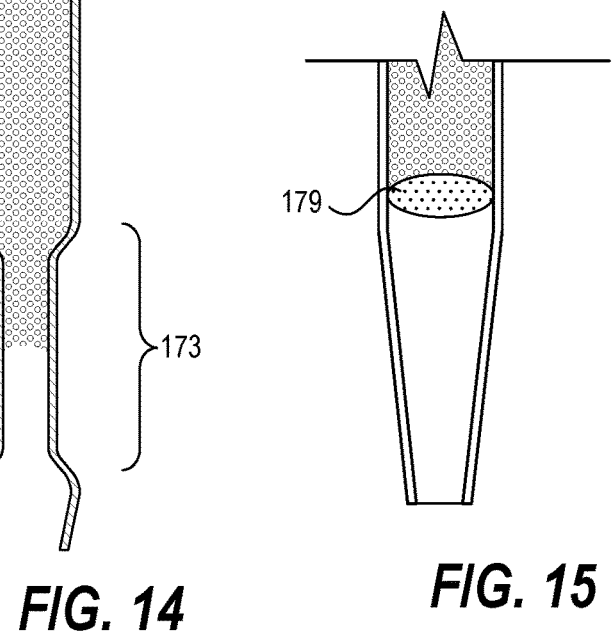
FIG. 15 is a cross-sectional schematic view of a nozzle and meniscus control device as described herein.

Other embodiments for holding a meniscus position include configuring the dispense nozzle and/or nozzle region to use capillary action. Capillary action can be used to create a zone having a pressure difference without moving process fluid. In one embodiment, substantial pressure differences are created across a nozzle by using a feature in the nozzle. For example, a sieve plate can be positioned within the nozzle just prior to the nozzle opening (or a fine filter, mesh, et cetera). By way of a non-limiting embodiment, for photoresist dispensing using a conduit with a nozzle opening of approximately 1 mm, a plate having a plurality of micron scale openings can be used. After process fluid passes through the sieve, process fluid can easily fall on a substrate positioned below the nozzle. After reducing pressure to the process fluid, the process fluid is held on the conduit side of the sieve. There is then a threshold pressure needed to overcome the capillary action of the sieve plate before process fluid can exit the nozzle. Accordingly, the capillary action from the sieve plate can hold a meniscus of the process fluid within the nozzle region. FIG. 15 illustrates an example nozzle region using sieve plate 179 to maintain meniscus position.

Figure 14:
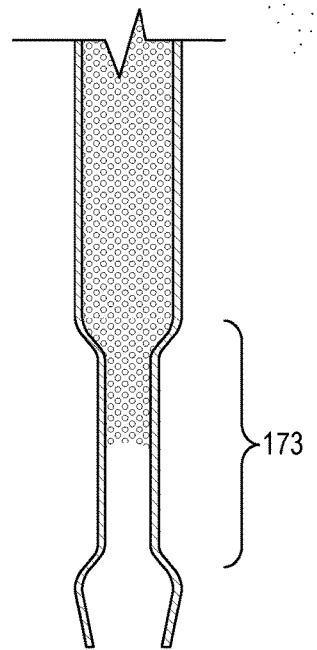
FIG. 14 is a cross-sectional schematic view of a nozzle and meniscus control device as described herein.

Another embodiment can include using a narrowed fluid conduit immediately prior to the dispense nozzle. As the diameter of a tube narrows, capillary forces increase and adhesive forces between the liquid and tube can increase. Thus, with a narrowed opening immediately prior to exiting the dispense nozzle, fluid adhesive forces in this zone can increase. If process fluid pressure in the process fluid conduit is sufficiently reduced, then process fluid that has passed this narrowed zone shears off and exists the dispense nozzle, remaining process fluid is held within the narrowed conduit from adhesive forces. Some threshold pressure greater than zero is then needed to restart dispensing process fluid. Otherwise, process fluid can be held within an open dispense nozzle without dripping out of the dispense nozzle. FIG. 14 illustrates an example dispense nozzle region with zone 173 having a narrowed diameter as compared to an upstream diameter to increase capillary action. By way of a non-limiting example, if a process fluid conduit has a 1 mm diameter, and a dispense nozzle has a 0.8 mm diameter, then a length of the conduit immediately before the dispense nozzle can have a diameter of 0.5 mm. Such an embodiment can work with or without a meniscus sensor and with or without an evaporation prevention mechanism.

Accordingly, embodiments herein provide a fluid delivery system. Such a system can include a hydraulic housing defining a chamber with an elongate bladder positioned within the chamber. The elongate bladder extends from a chamber inlet opening to a chamber outlet opening of the chamber. The chamber provides a bladder expansion constraint that permits expansion of the elongate bladder to a predetermined volume and prevents expansion of the elongate bladder beyond the predetermined volume. For example, a sleeve can be positioned within the chamber, or the chamber itself can be sized to provide an expansion constraint.

The elongate bladder defines a fluid flow path that is linear between the chamber inlet opening and the chamber outlet opening. The elongate bladder is configured to laterally expand and laterally contract within the chamber such that when the elongate bladder contains process fluid, a volume of the process fluid within the elongate bladder is increasable and reducible. In other words, as process fluid flows through a fluid delivery line, process fluid enters a tubular bladder that substantially maintains laminar flow, but that can laterally expand creating a larger cross-sectional area, while maintaining a tube-like shape. Various expansion mechanisms can be used for the elongate bladder. One mechanism is selecting the bladder from an elastomeric material that can stretch and shrink.

The chamber is configured to contain hydraulic fluid in contact with an exterior surface of the elongate bladder. The hydraulic fluid housing includes a displacement chamber in fluid connection with the chamber. The displacement chamber includes a displacement member that is insertable into the displacement chamber and retractable from the displacement chamber. The bladder chamber and the displacement chamber can optionally be a same chamber or container. Alternatively, they can be separate chambers with one or more fluid conduits for hydraulic fluid to move back and forth.

The system includes a controller configured to activate a volume-control system that selectively decreases hydraulic fluid pressure on the elongate bladder by retracting a portion of the displacement member from the displacement chamber causing expansion of the elongate bladder. The controller is configured to activate the volume-control system that selectively increases hydraulic fluid pressure on the elongate bladder by inserting a portion of the displacement member into the displacement chamber causing contraction of the elongate bladder.

Some embodiments can include the displacement member being a piston having a diameter or cross sectional area that mostly or completely fills an inner diameter of the displacement chamber. In other words, the displacement member can push or pull essentially all of hydraulic fluid in contact with a face of a piston. In other embodiments, the displacement member is a rod having a cross-sectional height less than an inner height of the displacement chamber. This can be similar to a pin inserted into fluid and displacing fluid by virtue of solid volume introduced into the chamber with hydraulic fluid in contrast to a displacement member in contact with all interior walls of the displacement chamber where inserted. Both the face/end and shaft of the rod is in contact with the hydraulic fluid, and so it is a volume of the rod that causes displacement of hydraulic fluid. Other embodiments can use combinations of pistons and rods which can move in unison or independently of each other, with a piston typically causing greater displacement of hydraulic fluid as compared to the rod. Yet other embodiments can include a bellows or diaphragm pushed back and forth by the actuator.

The chamber can be configured to enable hydraulic fluid to surround the elongate bladder. The chamber can include a rigid, elongate sleeve that conforms to a shape of the elongate bladder. In other embodiments, the chamber walls themselves are sized to conform to the shape of the bladder. This sleeve can have multiple openings for ingress and egress of hydraulic fluid. An anti-backlash mechanism can be configured to apply pressure to the hydraulic fluid sufficient to increase a pressure response of the displacement member.

The volume-control system is configured to respond to input from process fluid sensors such as flow rate, meniscus position, etc. The elongate bladder is comprised of an elastomeric material. Other flexible materials can be used that enable expansion and contraction of the elongate bladder. For example, various plastics can be used. The elongate bladder can have a circular, oval, or oblong cross-sectional shape. Using an oblong cross-sectional shape can be beneficial for better deformability with flat surfaces. The elongate bladder has a length that is greater than a cross-sectional height. Bladders conventionally used for industrial applications typically have a round or square shape as a container for excess material. The bladder herein is sized and shaped to be similar to a fluid conduit to promote continued laminar flow as much as possible. With a sufficiently long bladder, lateral expansion can be relatively small and still provide enough increase in volume to collect a charge of fluid, hold a meniscus position, and dispense the collected charge of fluid.

Another embodiment includes an apparatus for fluid delivery. A hydraulic fluid housing defines a chamber having a chamber inlet opening and a chamber outlet opening. An elongate bladder is positioned within the chamber and extends from the chamber inlet opening to the chamber outlet opening. The elongate bladder defines a fluid flow path that is linear between the chamber inlet opening and the chamber outlet opening. The elongate bladder is configured to contain process fluid within the elongate bladder separate from hydraulic fluid contained within the chamber. The elongate bladder is configured to laterally expand and laterally contract within the chamber such that when the elongate bladder contains process fluid a volume of the process fluid within the elongate bladder is increasable and reducible. The elongate bladder can have a length that is at least four times greater than a cross-sectional height of the elongate bladder.

A bladder expansion constraint is configured to permit expansion of the elongate bladder within the chamber to a predetermined volume and to prevent expansion of the elongate bladder beyond a predetermined lateral expansion value. The bladder expansion constraint can be an elongate sleeve that is rigid that is positioned around the elongate bladder such that an interior surface of the elongate sleeve prevents the elongate bladder from expanding beyond an interior diameter of the sleeve. The elongate sleeve can define one or more openings for ingress and egress of hydraulic fluid within the bladder expansion constraint. Alternatively, chamber walls or other wire mesh or other physical constraints can be used to constrain expansion.

The chamber is configured to maintain hydraulic fluid in contact with an exterior surface of the elongate bladder. A displacement member is insertable into the chamber and retractable from the chamber. The controller is configured to activate a volume-control system that selectively decreases hydraulic fluid pressure on the elongate bladder by retracting a portion of the displacement member from the chamber causing expansion of the elongate bladder. The controller is also configured to activate the volume-control system that selectively increases hydraulic fluid pressure on the elongate bladder by inserting a portion of the displacement member into the chamber causing contraction of the elongate bladder.

In other embodiments, the controller is constructed and arranged to expand the elongate bladder to a diameter greater than a diameter of the chamber inlet opening such that process fluid collects in the elongate bladder. A filter can be positioned upstream of the chamber inlet opening via a fluid inlet conduit positioned to filter the process fluid at a filtration rate before the process fluid enters the elongate bladder. A dispense nozzle can be positioned downstream of the chamber outlet opening via a fluid conduit.

Accordingly, a high-purity, high-precision dispense system is provided.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. An apparatus for fluid delivery, the apparatus comprising:
   a hydraulic fluid housing defining a chamber having an elongate bladder positioned within the chamber, the elongate bladder extending from a chamber inlet opening to a chamber outlet opening, the chamber including a bladder expansion constraint that permits expansion of the elongate bladder to a predetermined volume that is less than a volume of the chamber and prevents expansion of the elongate bladder beyond the predetermined volume, the bladder expansion constraint spanning a length of the bladder and including a plurality of perforations on walls thereof to allow flow of hydraulic fluid in and out of the bladder expansion constraint;
   the elongate bladder defining a fluid flow path that is linear between the chamber inlet opening and the chamber outlet opening, the elongate bladder being configured to laterally expand and laterally contract within the chamber such that when the elongate bladder contains process fluid, a volume of the process fluid within the elongate bladder is increasable and reducible;
   the chamber configured to contain the hydraulic fluid in contact with an exterior surface of the elongate bladder;
   the hydraulic fluid housing including a displacement chamber in fluid connection with the chamber, the displacement chamber including a displacement member that is insertable into the displacement chamber and retractable from the displacement chamber; and
   a controller configured to activate a volume-control system that selectively decreases hydraulic fluid pressure on the elongate bladder by retracting a portion of the displacement member from the displacement chamber causing expansion of the elongate bladder, the controller configured to activate the volume-control system that selectively increases hydraulic fluid pressure on the elongate bladder by inserting a portion of the displacement member into the displacement chamber causing contraction of the elongate bladder,
   wherein the bladder expansion constraint is an elongate sleeve that is rigid and that is positioned around the elongate bladder, and
   the elongate sleeve defines one or more openings for ingress and egress of hydraulic fluid within the bladder expansion constraint.

2. The apparatus of claim 1, wherein the displacement member includes a piston having a piston diameter that fills an inner diameter of the displacement chamber.

3. The apparatus of claim 1, wherein the displacement member is a rod having a cross sectional height that is less than half of an inner height of the displacement chamber.

4. The apparatus of claim 3, wherein the displacement member further includes a rod and a piston, the rod and piston configured to move independently of each other, the piston causing greater displacement of the hydraulic fluid as compared to the rod.

5. The apparatus of claim 1, further comprising an anti-backlash mechanism configured to apply pressure to an actuator to increase a pressure response of the displacement member.

6. The apparatus of claim 1, wherein the elongate bladder is comprised of an elastomeric material.

* * * * *